United States Patent [19]

Worley et al.

[11] 4,099,163
[45] Jul. 4, 1978

[54] METHOD AND APPARATUS FOR DIGITAL DATA TRANSMISSION IN TELEVISION RECEIVER REMOTE CONTROL SYSTEMS

[75] Inventors: David W. Worley; Paul D. Filliman, both of Fort Wayne, Ind.

[73] Assignee: The Magnavox Company, Fort Wayne, Ind.

[21] Appl. No.: 671,204

[22] Filed: Mar. 29, 1976

[51] Int. Cl.² .................................. H04Q 9/14
[52] U.S. Cl. .................. 340/168 B; 340/147 SY; 340/365 S
[58] Field of Search .......... 340/168 B, 167 R, 164 R, 340/147 MD, 365 S, 345; 325/391, 392, 30, 64

[56] References Cited

U.S. PATENT DOCUMENTS

| | | | |
|---|---|---|---|
| 3,252,142 | 5/1966 | Takenaka | 340/164 R |
| 3,443,032 | 5/1969 | Mitsui | 340/168 R |
| 3,629,831 | 12/1971 | Mikus et al. | 340/152 R |
| 3,811,112 | 5/1974 | Hoven et al. | 340/164 |
| 3,846,639 | 11/1974 | Ueda et al. | 340/147 R |
| 3,872,435 | 3/1975 | Cestaro | 340/147 MD |
| 3,919,641 | 11/1975 | Kurokawa et al. | 325/30 X |
| 3,946,362 | 3/1976 | Sumida et al. | 340/147 SY |
| 3,968,477 | 7/1976 | Sumida et al. | 340/167 R |
| 3,974,451 | 8/1976 | Maeder | 325/392 |
| 3,995,120 | 11/1976 | Pachynski, Jr. | 179/15 BS |

*Primary Examiner*—Donald J. Yusko
*Attorney, Agent, or Firm*—George R. Pettit

[57] ABSTRACT

Method and apparatus for serial data transmission wherein each data word has a fixed bit length and each bit is transmitted during a fixed duration data period following a sync pulse. The sync pulse for each data word has a duration equal to a data period. Each data bit pulse has a duration less than a data period. The method and apparatus is particularly suitable for remote control systems for use with television receivers.

3 Claims, 6 Drawing Figures

METHOD AND APPARATUS FOR DIGITAL DATA TRANSMISSION IN TELEVISION RECEIVER REMOTE CONTROL SYSTEMS

DESCRIPTION OF THE PRIOR ART

The great majority of prior art television receiver remote control systems have utilized an ultrasonic link between the remote transmitter and the remote receiver located at the television receiver. In early ultrasonic systems, a discrete ultrasonic frequency was assigned to each function to be controlled. Such systems, however, are useful for controlling only a small number of functions. This is due to the limited bandwidth in the ultrasonic frequency range, the difficulty of maintaining frequency stability, and the difficulty in economically building a remote receiver that is sufficiently selective to distinguish among more than a few ultrasonic frequencies. Many of the same limitations apply to remote control systems utilizing an optical link between the remote transmitter and receiver wherein a transmitted light signal (usually in the infrared range) is modulated by a discrete ultrasonic frequency for each function to be controlled.

Other ultrasonic systems have utilized pairs of ultrasonic frequencies to increase the number of functions that can be remotely controlled. Thus, for each function to be controlled, two frequencies are transmitted, either simultaneously or serially for predetermined time periods. In this manner, five ultrasonic frequencies utilized two at a time will produce ten unique frequency pairs. Six frequencies will produce 15 unique pairs; seven frequencies will produce 21 unique pairs, and so on. Because of the limitations mentioned earlier, it becomes economically prohibitive to build a system having more than five or six discrete ultrasonic frequencies.

There has developed a need to provide for a much larger data capacity between the remote transmitter and the television receiver. This is because it has become desirable not only to remotely control a larger number of receiver functions, but also to randomly select any desired channel for viewing.

An obvious way to increase the data capacity of the system was to use digital techniques. Thus, a single ultrasonic frequency could be pulsed to transmit a serial data stream. However, attempts to build such a system that was economical and reliable were met with many difficulties. Because of the limited bandwidth in the ultrasonic frequency range, the bit rate was necessarily low. Reflected signals caused interference with the direct signal. It was difficult to synchronize the receiver with the transmitter.

Digital techniques have also been applied to remote control systems utilizing an optical link. Such systems overcome the problem of reflected signals and the wider available bandwidth permitted adequate bit rates. However, the problem of reliably synchronizing the receiver with the transmitter remained unsolved.

It is therefore an object of the present invention to provide a method and apparatus for serial data transmission suitable for use with a television receiver remote control system having an optical link that will overcome the problem of synchronizing the receiver with the transmitter to provide reliable data transmission and reception.

SUMMARY OF THE INVENTION

The present invention comprises a method and apparatus for serial data transmission. Each data word has a fixed bit length and each bit is transmitted during a fixed duration data period. A sync pulse having a duration equal to a data period is transmitted prior to the transmission of each data word. The presence of a data pulse during a data period corresponds to a bit value of "1" and the absence of a data pulse during a data period corresponds to a bit value of "0". Each data pulse has a duration equal to approximately 50% of a data period and centrally positioned therein.

The apparatus for transmitting the serial data includes a biphase clock, a data period counter, and a plurality of sequential gates that are serially enabled by signals from the clock and the data period counter. The apparatus for receiving the transmitted serial data includes a sync pulse detector, a biphase digital clock, a data period counter, and a plurality of sequential gates that are serially enabled by signals from the clock and the data period counter.

Detailed circuitry for utilizing the present method and apparatus in a remote control transmitter and receiver are shown and described in copending application, Ser. No. 671,205, filed Mar. 29, 1976, the same day as this application and now U.S. Pat. No. 4,045,777, in the names of Eugene P. Mierzwinski and David W. Worley, entitled "Remote Control Transmitter and Receiver for Use With A Television Receiver," common assignee, the disclosure of which is incorporated herein by reference.

Particular features and advantages of the invention will be readily apparent from the following detailed description of a preferred embodiment with reference to the accompanying drawings in which:

DETAILED DESCRIPTION OF THE PREFERRED EMBODIMENT

Figure 1:
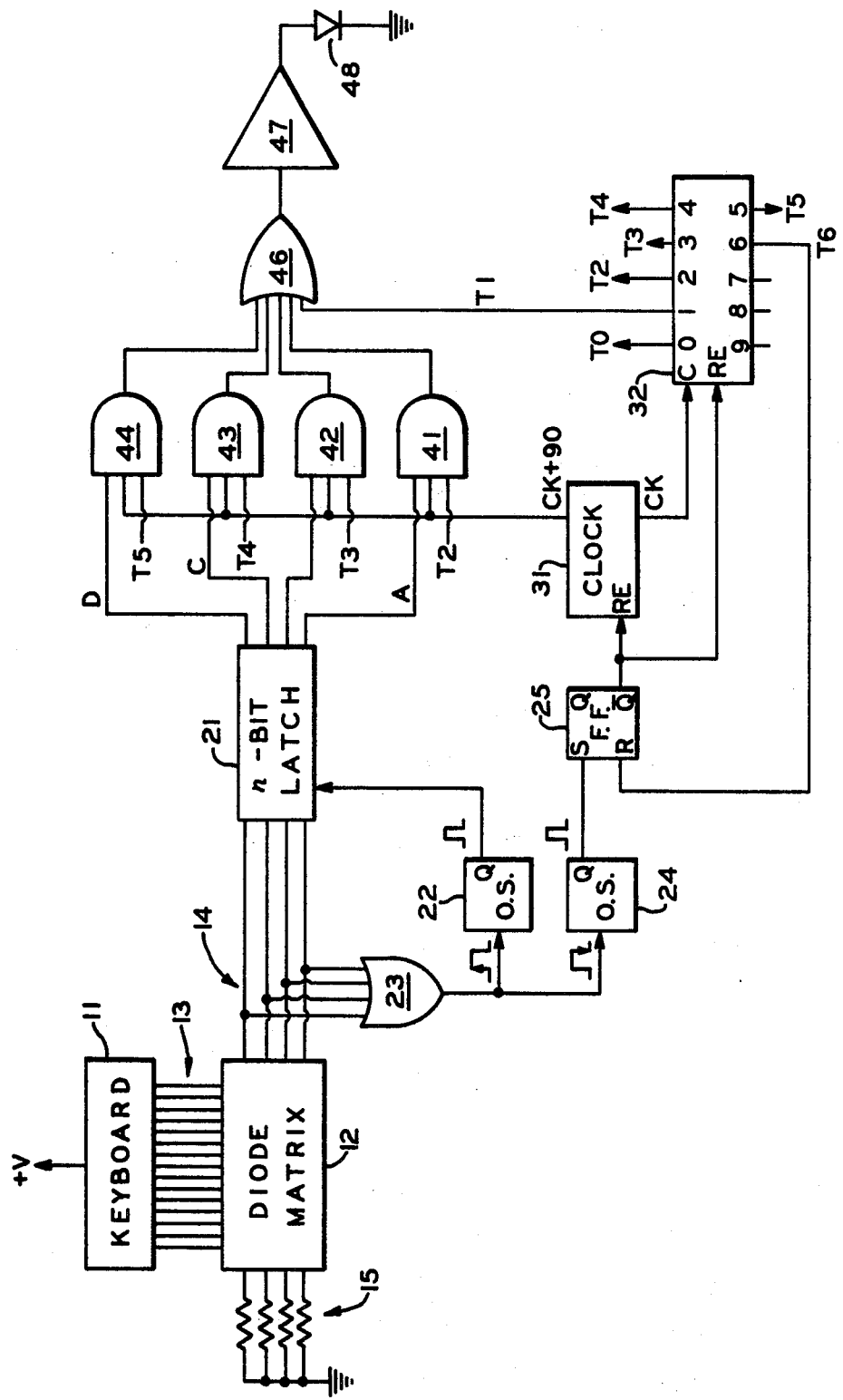
FIG. 1 is a logic block diagram of the apparatus as used in a remote transmitter for controlling a television receiver.

Referring now to FIG. 1, there is shown a key board 11 which may be of the kind commonly used with hand calculators. Each key switch of the key board has at least one pair of contacts. One contact of each pair is connected to one side of a dc source, indicated as +V. The other contact of each pair is connected to one input line of a diode matrix 12.

Diode matrix 12 has a plurality of input lines 13 equal in number at least to the number of key switches in key board 11. Diode matrix 12 has a plurality of output lines 14 equal in number to at least the number of binary digits (bits) required to uniquely identify each of the input lines. The input lines 13 are connected to the output lines through a plurality of diodes to provide a unique binary coded signal on the ouput lines for each input line. Such constructions are well known in the art and need not be further described herein.

Each of the output lines is connected to the other side of the dc source, indicated by the common or ground symbol, through a resistor 15. Hereafter a voltage at or near +V will be referred to as high and a voltage at or near common or ground potential will be referred to as low.

In operation, all the output lines 14 are low when no key switch is closed. Upon closure of a key switch, at least one output line will go high. This is because binary zero is not utilized. It should be noted at this point that only 15 input lines 13 and four output lines 14 are shown. However this showing is merely illustrative for sake of simplicity and ease of understanding, the use of more inputs and a sufficient number of outputs to provide unique binary coding for each input exclusive of binary zero being contemplated.

The output lines 14 provide the data inputs to an n-bit latch 21. The strobe input to latch 21 is taken from the Q output of a monostable multivibrator, (one shot) 22 connected to be triggered by a positive going signal at its input. This device may be an integrated circuit type SCL4528, which is readily available from a number of suppliers and is fully described in their respective catalogs and manuals.

The input to one shot 22 is taken from the output of an n-input OR gate 23 which receives its inputs from the output lines 14 of diode matrix 12. Thus, whenever a key switch of key board 11 is depressed, at least one of the output lines 14 will go high and trigger one shot 22 through OR gate 23.

Investigation has shown that even when a key switch of key board 11 is operated as rapidly as possible, its contacts remain closed for a minimum of several milliseconds, during which time the proper binary code for the depressed key switch is presented at the data inputs of latch 21. The astable time period of one shot 22 is selected to be only a few microseconds. Therefore, latch 21 is assured of being strobed while valid signals are present at its data inputs.

A one shot 24 connected to be triggered by a negative going signal also receives its input from OR gate 23. The Q output of one shot 24 is connected to the set input (S) of a flip flop 25. The astable time period of one shot 24 is selectd to be a few microseconds as required to set flip flop 25. Thus, upon release of a depressed key switch, one shot 24 will be triggered to set flip flop 25.

The $\overline{Q}$ output of flip flop 25 is connected to the reset-enable (RE) input of a digital biphase clock 31. Clock 31 produces two digital clock signals identified as CK and CK + 90. These two signals are substantially symmetrical square waves of the same frequency and phase displaced from one another by 90 electrical degrees. Clock 31 will be described in more detail subsequently, it being sufficient here to note that when its RE input is held high, clock 31 is maintained in a reset and disabled condition wherein CK and CK + 90 are held low. When the RE input goes low, clock 31 is enabled and produces CK and CK + 90 signals as illustrated in FIG. 2.

The CK signals provide the clock input to a Johnson or ring type counter 32. Counter 32 has 10 outputs numbered 0 through 9. In the reset state, output 0 is high and all other outputs are low. Counter 32 will be held in the reset condition and disabled from counting so long as its reset-enable (RE) input is high. When the reset-enable signal goes low, counter 32 is enabled to count clock pulses at its CP input. Only one output of counter 32 is high at a time. Thus, upon counting a first clock pulse, the 0 output goes low and the 1 output goes high. On counting the next clock pulse, output 1 returns low and output 2 goes high. This sequence continues and repeats until clock pulses are stopped or the counter reset.

Figure 2:
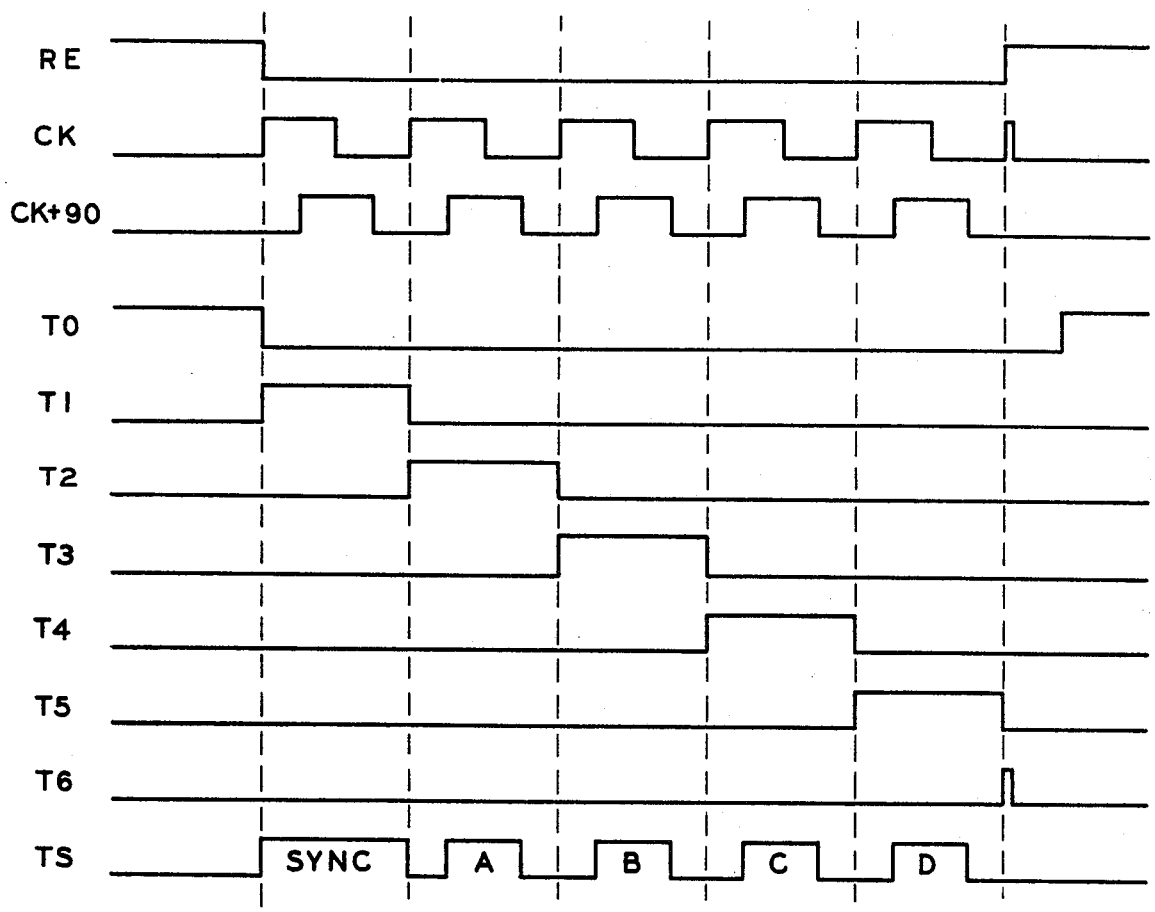
FIG. 2 is a graphical representation of several signal waveforms appearing at selected locations in the transmitter of FIG. 1.

The outputs 0–6 of counter 32 are identified as T0–T6 in FIG. 1 and the waveforms of these outputs are illustrated graphically in FIG. 2. Output 6 (T6) is connected to the reset input (R) of flip flop 25. Thus, upon counting a sixth clock pulse after being enabled, T6 goes high and resets flip flop 25, the $\overline{Q}$ output of which resets and disables clock 31 and counter 32. The resulting signal waveforms are shown in FIG. 2.

Four three-input AND gates 41, 42, 43, and 44, each receive one input from T2, T3, T4, and T5, respectively, and a second input from CK + 90. The third input of each AND gate 41–44 is taken from latch 21. In the 4-bit system illustrated, the four outputs of latch 21 are identified as A, B, C, and D. As shown, A is gated by T2 and CK + 90 through AND gate 41; B is gated by T3 and CK + 90 through AND gate 42; C is gated by T4 and CK + 90 through AND gate 43; and D is gated by T5 and CK + 90 through AND gate 44.

The outputs of AND gates 41–44 provide four inputs to a five-input OR gate 46, the fifth input of which is provided by T1. The output of OR gate 46 is identified as TS. FIG. 2 shows the waveform of TS when the binary member 1111 is transmitted. It will be noted that the data periods are defined by T2–T5, but the duration of the data pulses within the data periods is limited by CK + 90.

The signal TS is amplified by an oscillator/amplifier 47 to drive a light emitting diode 48, which transmits the signal TS in the form of modulated light pulses to the remote receiver.

Figures 3, 5, 6:
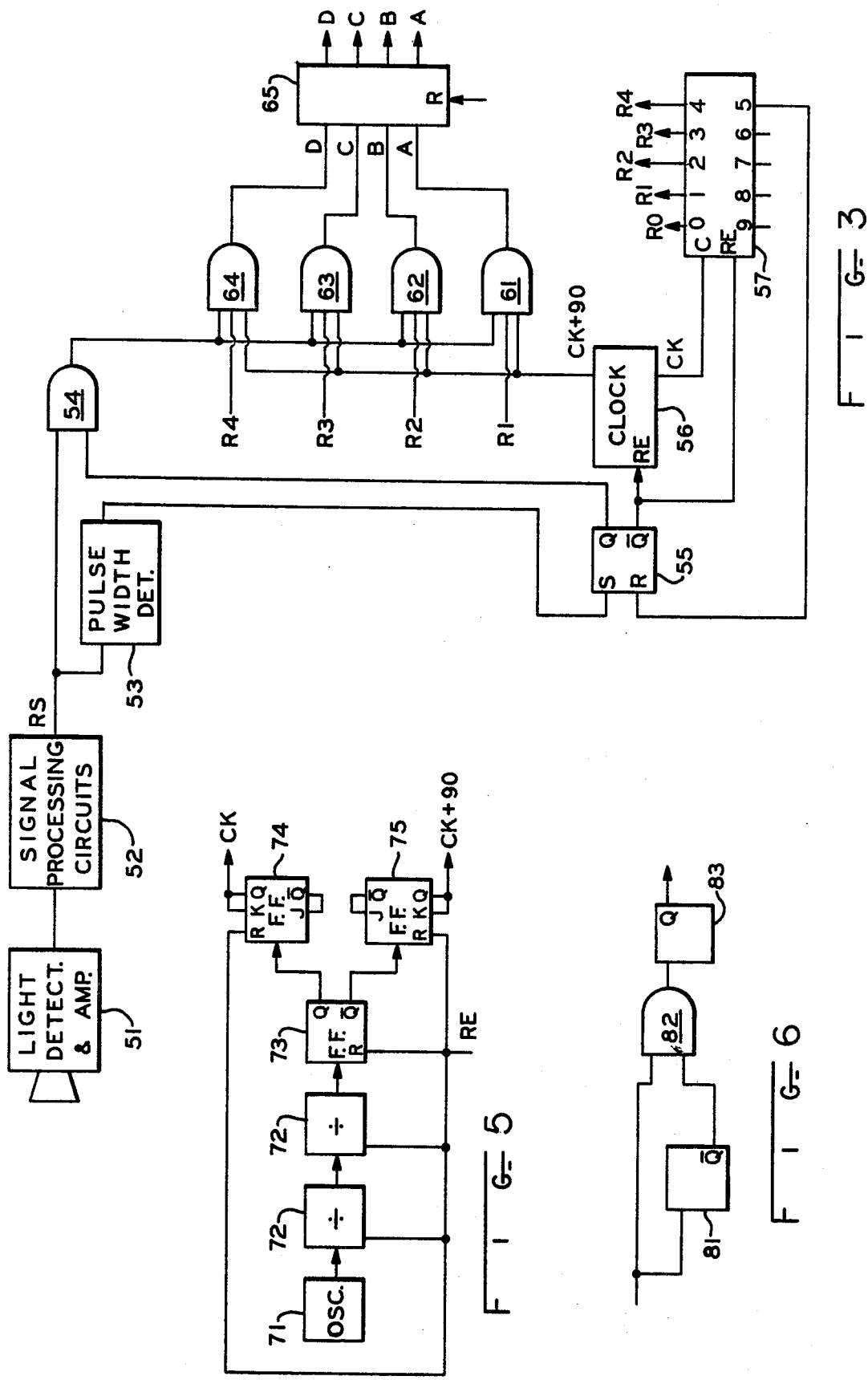
FIG. 3 is a logic block diagram of the apparatus of the present invention as used on a remote receiver for controlling a television receiver.
FIG. 5 is a logic block diagram of a digital clock suitable for use in either the transmitter of FIG. 1 or the receiver of FIG. 3.
FIG. 6 is a logic block diagram of a pulse width discriminator used in the present invention.

Referring now to FIG. 3, there is shown a light detector and amplifier 51 for receiving and amplifying the transmitted light signals from the remote transmitter. Signal processing circuits 52 demodulate the received signal and wave shape it to produce a signal RS which is substantially identical to the signal TS that is generated in the transmitter.

The signal RS provides the input to a pulse width detector 53. Pulse width detector 53 provides an output signal upon the termination of a pulse at its input if the pulse has a duration greater than a predetermined duration. In the present invention, pulse width detector 53 is selected to provide an output only for pulses having a duration somewhat greater than the data pulses. Thus, only sync pulses will cause detector 53 to produce an output signal. A preferred embodiment of detector 53 will be described subsequently.

The Q output of detector 53, which is normally low and makes a momentary high excursion at the trailing edge of a pulse of sufficient duration, is connected to the set input (S) of a flip flop 55. The Q output of flip flop 55 is connected to one input of a two-input AND gate 54, the other input of which is provided by the signal RS. It will be seen that gate 54 blocks signals from processing circuits 52 when the Q output of flip flop 55 is low and passes signals from processing circuits 52 when the Q output of flip flop 55 is high.

The $\overline{Q}$ output of flip flop 55 is connected to the reset-enable (RE) input of a digital biphase clock 56 that is substantially identical to clock 31 of the transmitter. When its RE input is high, clock 56 is held reset and disabled and the CK and CK + 90 clock signals are held low. When its RE input is low, clock 56 is enabled to produce clock signals CK and CK + 90.

A counter 57, substantially identical to previously described counter 32, has its reset-enable (RE) input connected to the $\overline{Q}$ output of flip flop 55. The clock input to counter 57 is provided by the CK clock signal from clock 56. Outputs 0-5 of counter 57 are identified as R0, R1, R2, R3, R4, and R5.

A plurality of three-input AND gates 61, 62, 63, and 64 each receive one input from R1, R2, R3, and R4, respectively; and a second input from the output of AND gate 54. The third input of each AND gate 61-64 is provided by the CK + 90 signal from clock 56. The outputs of AND gates 61-64 are connected to the inputs of buffer storage 65, which may comprise a plurality of flip-flops, one for each input.

Figure 4:
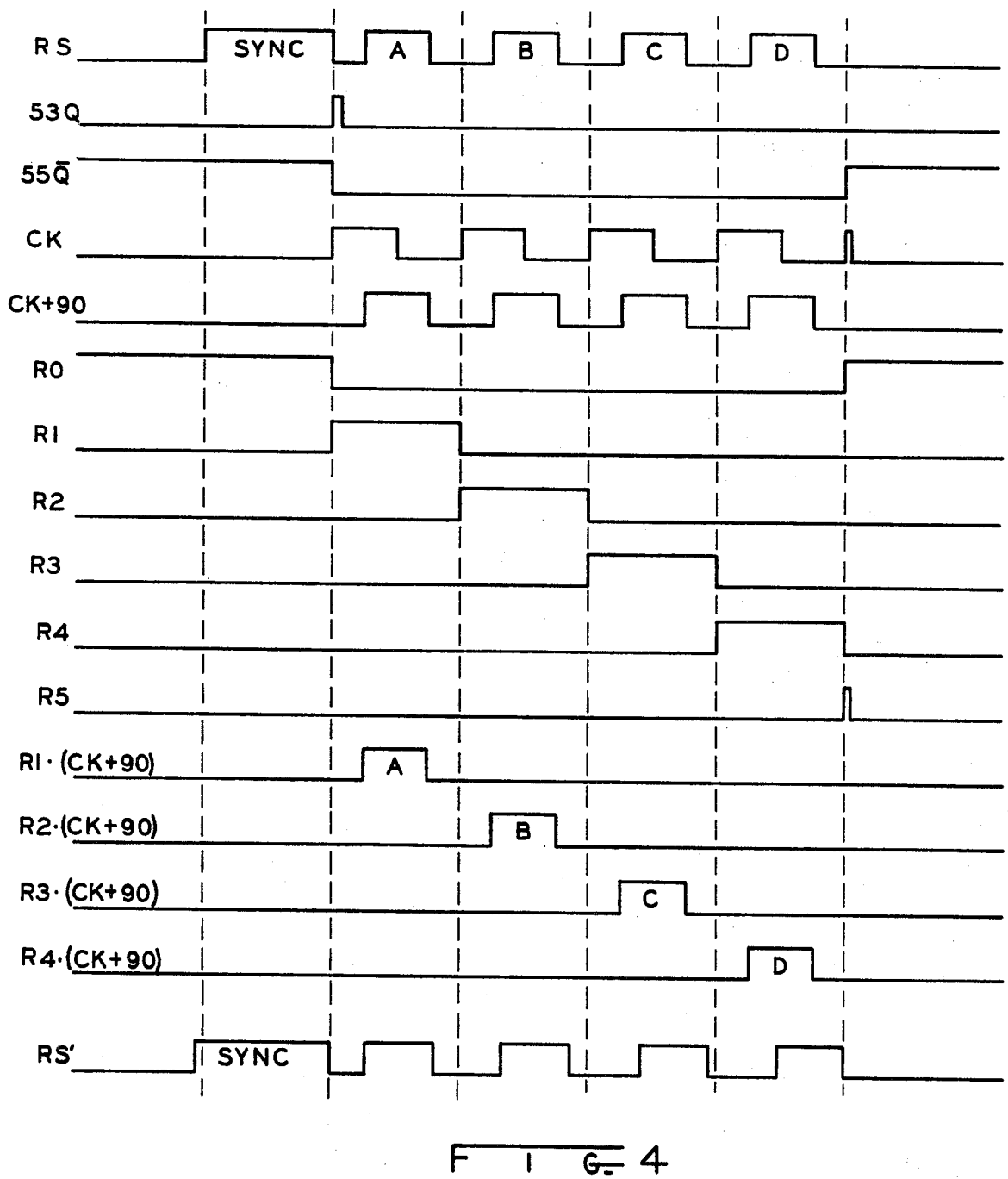
FIG. 4 is a graphical representation of several signal waveforms appearing at selected locations in the receiver of FIG. 3.

The operation of the receiver will be clearly understood with reference to FIG. 4 which graphically shows the waveforms of several signals. The outputs RS of signal processing circuits 52 is shown for the data word 1111. The four data bits A, B, C, and D follow a valid sync pulse SYNC.

Upon termination of the sync pulse SYNC the Q output of detector 53, indicated as 53Q goes momentarily high, and operates to set flip flop 55. The $\overline{Q}$ output of flip flop 55, indicated as 55$\overline{Q}$, goes low, enabling clock 56 and counter 57. The CK and CK + 90 outputs of clock 56 are also shown.

When clock 56 and counter 57 are enabled, counter 57 begins to count CK clock pulses causing R0 to go low and each of the other outputs R1-R5 to go high sequentially as shown in FIG. 4. When R5 goes high, it resets flip flop 55, causing 55$\overline{Q}$ to return high and reset clock 56 and counter 57. Thus, R5 will not remain high for a full cycle of CK as do R1-R4, but will return low as soon as 55$\overline{Q}$ goes high. Simultaneously, R0 will return high and remain there until another sync pulse is detected and the above described cycle is repeated.

AND gates 61-64 are sequentially enabled by R1-R4, but only during so much of each data period when CK + 90 is high. The time periods during which gates 61-64 are enabled are identified respectively as R1·(CK + 90), R2·(CK + 90), R3·(CK + 90), and R4·(CK + 90).

If clock 56 is running at the same frequency as the transmitter clock, the time periods during which each gate 61-64 is enabled will coincide exactly with the time periods during which data pulses representing binary ones are present to be gated. However, exact synchronism between the transmitter and receiver clocks is not required for the system of the present invention to function properly. To the contrary, the system of the present invention will function reliably even when a considerable frequency difference exists between the transmitter and receiver clocks.

This feature is illustrated by FIG. 4, which shows a received signal waveform RS′ from a transmitter having a clock running between 6 and 7 percent slower than the receiver clock. It will be seen that there is sufficient overlap between each data pulse of the signal RS′ and the times each gate 61-64 is enabled to properly enter the correct number in buffer storage 65. It should be noted that false data will not be entered in buffer 65 because there is no improper time overlap between the received data and the periods during which each gate 61-64 is enabled.

The system of the present invention, utilizing four data bits, will operate reliably with a frequency difference between the transmitter and receiver clocks that is as great as plus or minus 12 percent. As the bit size is increased, less variation can be tolerated. However, even with an eight-bit data word, the system will tolerate a plus or minus 6 percent frequency variation, and this is well within the range of manufacturing tolerance for the master oscillators used in the transmitter and receiver clocks.

Referring now to FIG. 5, there is shown a block diagram representative of the digital clocks used in the present invention. A master oscillator 71 operates in the ultrasonic or low radio frequency range, say about 34KHz. Frequency divider circuits 72, which may comprise a plurality of toggle flip flops connected in series, divide the pulses from master oscillator 71 by an integral number, say 40. This may be achieved by a ÷10 circuit and a ÷4 circuit, both of which are readily available from a number of integrated circuit manufactures.

A toggle flip flop 73 further divides the frequency by two, and alternately triggers JK flip flops 74 and 75 from its Q and $\overline{Q}$ outputs. It will be understood by persons skilled in the art that the outputs of flip flops 74 and 75 identified as CK and CK + 90, respectively, will provide another ÷2 function, and will also be phase displaced from each other by one-quarter cycle or 90 electrical degrees as shown in FIGS. 2 and 4. These signals have a frequency of approximately 34KHz ÷ 160, or about 212Hz.

Pulse width detector 53 may take the form shown in FIG. 6. A retriggerable monostable multivibrator 81, connected to trigger on positive going transitions of the received signal RS has an astable time period slightly shorter than the duration of sync pulses SYNC. The $\overline{Q}$ output of monostable multivibrator 81 provides one input to an AND gate 82, the other input of which is provided by the received signal RS.

Upon receipt of a positive going transistion, indicating the beginning of a received pulse (sync, data, noise, etc.), the $\overline{Q}$ output of monostable multivibrator 81 will go low and remain there for the astable time period. If the received pulse is of sufficient duration, indicating a valid sync signal, the pulse will still be present when $\overline{Q}$ returns high. This will cause the output of AND gate 82 to go high and remain there until the received pulse ends.

A second monostable multivibrator 83 is connected to trigger on negative going transitions. Thus, monostable circuit 83 will not be triggered when the output of AND gate 82 goes high, but will be triggered when it returns low, which occurs at the end of a valid sync pulse. The Q output of monostable circuit 83 is the output of pulse width detector 53, indicated as 53Q in FIG. 4. The astable time period of monostable circuit 83 is selected to be long enough to reliably trigger flip flop 55.

The master oscillator of the receiver clock is free running, and therefore may be in either state at the instant an incoming sync pulse terminates and the receiver clock counter chain is enabled. However, the resultant CK and CK + 90 signals can never be off in time by more than one cycle of the master oscillator, or one part in 160 of a data period, too small an amount to be of significance.

Buffer storage 65 is provided with a reset terminal (R) for resetting or erasing the data stored therein. Buffer 65 is reset prior to receipt of each new data word. The Q output of pulse width detector 53 may be used for this purpose. Also, it is desirable to perform decoding operations on the received data. Such operations may be initiated by the R5 output of counter 57.

It should be understood that the foregoing has described and illustrated a presently preferred embodiment of the present invention, and that many variations of the basic invention may suggest themselves to persons skilled in the art. Therefore, the foregoing description and drawing should be considered to be illustrative and not restrictive in character, reference being made to the appended claims.

The invention claimed is:

1. In a remote control transmitter of the kind suitable for remotely controlling a television receiver, apparatus for converting parallel digital coded signals to serial digital coded signals comprising:
   a source of parallel digital coded signals;
   a digital clock for producing first and second clock signals, said two clock signals being substantially identical in waveform and frequency and phase displaced from each other by 90 electrical degrees;
   a digital counter for sequentially producing a plurality of enabling signals in response to said first clock signal, each enabling signal having a duration equal to one full cycle of said first clock signal;
   sequential gating means for sequentially gating a sync pulse and a plurality of data pulses to a common output, said sync pulse being gated during a first of said enabling signals, said parallel digital signals being gated sequentially during second subsequent enabling signals by said second clock signal.

2. Apparatus for receiving serial digital coded signals and converting them to parallel digital coded signals, wherein said received signals are of the form having a predetermined number of equal time data periods, the first data period contains a sync pulse having a duration equal to a data period, and at least one subsequent data period contains a data pulse, the duration of each data pulse being less than the duration of a data period, said apparatus comprising:
   a digital clock for producing first and second clock signals, said two clock signals being substantially identical in waveform and frequency and phase displaced from each other by 90 electrical degrees;
   a digital counter for sequentially producing a plurality of enabling signals in response to said first clock signal, each enabling signal having a duration equal to one full cycle of said first clock signal;
   means for detecting a received sync pulse and for enabling said first and second clock signals and said counter upon the termination of said received sync pulse;
   sequential gating means having a common data input and a plurality of data outputs for sequentially gating the received signal to first subsequent output during second and subsequent data periods of the received signal, said sequential gating means being under the control of said enabling signals from said counter and said second clock signal.

3. The method of converting n-bit parallel digital coded signals to serial digital coded signals for transmission from a transmitter to a receiver comprising the steps of:
   (1) generating sequentially n+1 equal time data periods;
   (2) generating a sync pulse during the first of said data periods; said sync pulse having a duration equal to said data period; and
   (3) sequentially gating each bit of said parallel digital coded signal during the remaining time data periods whereby said bits form a pulse train which follows said sync pulse.

* * * * *